US010950913B1

(12) United States Patent (10) Patent No.: US 10,950,913 B1
Goldin et al. (45) Date of Patent: Mar. 16, 2021

(54) IMPACT ABSORBING MEMBER FOR A CONFORMAL WEARABLE BATTERY

(71) Applicant: Inventus Power, Inc., Woodridge, IL (US)

(72) Inventors: Elijah Brett Goldin, Chicago, IL (US); Kevin James Zwart, Woodridge, IL (US)

(73) Assignee: Inventus Power, Inc., Woodridge, IL (US)

( * ) Notice: Subject to any disclaimer, the term of this patent is extended or adjusted under 35 U.S.C. 154(b) by 0 days.

(21) Appl. No.: 17/086,132

(22) Filed: Oct. 30, 2020

Related U.S. Application Data

(63) Continuation-in-part of application No. 17/038,287, filed on Sep. 30, 2020.

(51) Int. Cl.
| | |
|---|---|
| *H01M 50/20* | (2021.01) |
| *H05K 1/02* | (2006.01) |
| *H01M 10/0583* | (2010.01) |
| *H01M 50/502* | (2021.01) |

(52) U.S. Cl.
CPC ....... *H01M 50/20* (2021.01); *H01M 10/0583* (2013.01); *H01M 50/502* (2021.01); *H05K 1/028* (2013.01); *H05K 1/0271* (2013.01); *H05K 1/0287* (2013.01); *H01M 2220/30* (2013.01)

(58) Field of Classification Search
CPC ............... H01M 50/20; H01M 50/502; H01M 10/0583; H01M 2220/30; H05K 1/0271; H05K 1/028; H05K 1/0287
See application file for complete search history.

(56) References Cited

U.S. PATENT DOCUMENTS

| | | | |
|---|---|---|---|
| 3,993,507 | A | 11/1976 | Hardigg |
| 4,053,685 | A | 10/1977 | Rowley et al. |
| 4,346,151 | A | 8/1982 | Uba et al. |
| 4,658,498 | A | 4/1987 | Yamaura et al. |
| 6,376,126 | B1 | 4/2002 | Faust et al. |
| 6,410,184 | B1 | 6/2002 | Horiuchi et al. |
| 6,528,204 | B1 | 3/2003 | Hikmet et al. |
| 6,773,848 | B1 | 8/2004 | Nortoft et al. |
| 8,192,863 | B2 | 6/2012 | Best et al. |

(Continued)

FOREIGN PATENT DOCUMENTS

| | | |
|---|---|---|
| CN | 201922162396 | 7/2020 |
| KR | 20080056978 A | 6/2008 |

(Continued)

OTHER PUBLICATIONS

Rogers Corporation, "PORON® ShockSeal™ 4790-79 Foams," visited on Nov. 2, 2020 at <https://rogerscorp.com/Elastomeric%20Material%20Solutions/PORON%20Industrial%20Polyurethanes/PORON%20ShockSeal%204790%2079%20Foams>, 3 pp.

(Continued)

*Primary Examiner* — Jane J Rhee
(74) *Attorney, Agent, or Firm* — Banner & Witcoff, Ltd.

(57) ABSTRACT

A battery system that is formed from a plurality of battery cells arranged on a flexible printed circuit card, where the flexible printed circuit card is folded along an axis forming an upper and lower portion of the flexible circuit card. A visco-elastic shock-absorbing member installed between the upper and lower portion of the flexible circuit card. Each battery cell may also have a visco-elastic shock-absorbing member that is attached individually to each battery cell of the plurality of battery cells.

20 Claims, 8 Drawing Sheets

(56) References Cited

U.S. PATENT DOCUMENTS

| | | |
|---|---|---|
| 8,795,880 B2 | 8/2014 | Matsubara |
| 8,860,372 B2 | 10/2014 | Guang et al. |
| 8,927,137 B2 | 1/2015 | Ayub et al. |
| 9,564,761 B2 | 2/2017 | Hopfer, III et al. |
| 9,640,831 B2 | 5/2017 | Tajima et al. |
| 9,660,225 B2 | 5/2017 | Miyake |
| 9,755,279 B2 | 9/2017 | Moon |
| 9,756,733 B2 | 9/2017 | Drzaic et al. |
| 9,780,421 B2 | 10/2017 | Palanchon et al. |
| 9,843,073 B2 | 12/2017 | Yoneda et al. |
| 9,941,506 B2 | 4/2018 | Hiroki et al. |
| 10,056,584 B2 | 8/2018 | Hwang |
| 10,134,528 B2 | 11/2018 | Stockman |
| 10,224,517 B2 | 3/2019 | Kimura |
| 10,236,492 B2 | 3/2019 | Miyake |
| 10,320,025 B2 | 6/2019 | Hiroki et al. |
| 10,388,939 B2 | 8/2019 | Urano et al. |
| 10,686,167 B2 | 6/2020 | Goto et al. |
| 2002/0017700 A1 | 2/2002 | Mori et al. |
| 2006/0210841 A1 | 9/2006 | Wallace et al. |
| 2008/0241677 A1 | 10/2008 | Garcia Alberola |
| 2008/0241680 A1 | 10/2008 | Lee et al. |
| 2009/0291361 A1 | 11/2009 | Scorziello |
| 2013/0295434 A1 | 11/2013 | Ayub et al. |
| 2014/0212695 A1 | 7/2014 | Lane et al. |
| 2015/0044511 A1 | 2/2015 | Kim et al. |
| 2015/0194697 A1 | 7/2015 | Hung et al. |
| 2015/0311495 A1 | 10/2015 | Wang |
| 2016/0156012 A1 | 6/2016 | Takahashi et al. |
| 2016/0218387 A1 | 7/2016 | Tajima |
| 2016/0233695 A1 | 8/2016 | Hopfer, III et al. |
| 2017/0018784 A1 | 1/2017 | Yun et al. |
| 2017/0025669 A1 | 1/2017 | Urano et al. |
| 2017/0079139 A1 | 3/2017 | Wu |
| 2018/0062197 A1 | 3/2018 | Thiel et al. |
| 2018/0175346 A1 | 6/2018 | Schmid-Schoenbein |
| 2018/0301741 A1 | 10/2018 | Kumar et al. |
| 2019/0088979 A1 | 3/2019 | Grady et al. |
| 2019/0090350 A1 | 3/2019 | Kumar |
| 2019/0237832 A1 | 8/2019 | Ju et al. |
| 2019/0305303 A1 | 10/2019 | Yebka et al. |
| 2019/0326647 A1 | 10/2019 | Kawai et al. |
| 2020/0127259 A1 | 4/2020 | Yoshida et al. |
| 2020/0243808 A1 | 7/2020 | Harutyunyan et al. |
| 2020/0245495 A1 | 7/2020 | Yi et al. |
| 2020/0403566 A1 | 12/2020 | Yamaai et al. |

FOREIGN PATENT DOCUMENTS

| | | |
|---|---|---|
| WO | 08023199 A1 | 2/2008 |
| WO | 17209052 A1 | 12/2017 |

OTHER PUBLICATIONS

Inventus Power, "Conformal Wearable Batteries Safe, 'Flexible, Wearable Power Designed to Increase Mission Effectiveness'," visited on Nov. 4, 2020 at <https://inventuspower.com/conformal-wearable-batteries/>, pp. 3.

Rebecca Cragun, et al., "Li-Ion Conformal Wearable Battery," EaglePicher Technologies, LLC visited on Feb. 9, 2020 at <http://www.powersourcesconference.com/Power%20Sources%202018%20Digest/docs/34-2.pdf>, pp. 577-580.

Eaglepicher Technologies, "Rechargeable Conformal Battery", visited on Feb. 9, 2020 at <https://www.eaglepicher.com/sites/default/files/SLB-101%20061419.pdf>, pp. 2.

IMPACT ABSORBING MEMBER FOR A CONFORMAL WEARABLE BATTERY

CROSS-REFERENCE TO RELATED APPLICATIONS

This application is a continuation-in-part of U.S. patent application Ser. No. 17/038,287 filed on Sep. 30, 2020, which is incorporated by reference in its entirety. This application is related to U.S. application No. 17/085,873, filed on Oct. 30, 2020, entitled "Housing for a Conformal Wearable Battery," U.S. application No. 17/085,991, filed on Oct. 30, 2020, entitled "Housing for a Conformal Wearable Battery," U.S. application No. 17/085,864 filed on Oct. 30, 2020, entitled "Flexible Battery Matrix for a Conformal Wearable Battery," and U.S. application No. 17/085,928, filed on Oct. 30, 2020, entitled "Flexible Battery Matrix for a Conformal Wearable Battery," which are being filed concurrently with this application and all of which are herein incorporated by reference in their entirety.

FIELD

Aspects described herein generally relate to portable electrical power storage systems.

More specifically, aspects of this disclosure relate to impact absorbing member to absorb or reduce shock and vibration forces seen by the electronic members for a portable electrical power storage system.

BACKGROUND

Portable battery systems may be utilized to provide mobile and/or remote location electrical power. Integrated communications equipment and/or weapons gear utilized, for example, by law enforcement and/or military personnel requires increasingly high levels of power storage carried proximate the user's body. Methods of increasing power storage capability in a device, such as a conformal wearable battery (CWB) are to include additional battery cells and/or use higher capacity battery cells. However, these solutions may unacceptably increase the size and/or weight of the resulting systems, reducing mobility.

In addition, batteries may come in different shapes and sizes depending on their intended usage. Some batteries may be arranged as packages of battery cells that are assembled together to provide a predetermined power output. These battery packages may be arranged in a durable and sealed housing to protect the batteries from damage. In some instances, the battery packages may be desired to flex or bend and may have shock or vibration absorbing features to accommodate their intended usage.

As such, a need has been recognized within the mobile electrical power storage industry for increasing power capacity while improving an overall user safety of these systems while simultaneously reducing their size and weight.

BRIEF SUMMARY

Aspects of the disclosure provide solutions that address and overcome technical problems associated with minimizing size of a portable battery system (e.g. a conformal wearable battery system).

Some aspects of this disclosure may relate to a conformal wearable battery (CWB) that includes: (a) a plurality of non-cylindrical shaped battery polymer cells; (b) a flexible printed circuit board (PCB) with a plurality of physical connection sections disposed in a grid like pattern, where each of the plurality of battery cells is physically affixed to the flexible PCB at a corresponding physical connection section of the plurality of physical connection sections and a bend axis that facilitates folding of the flexible PCB to form an upper portion of the flexible PCB and a lower portion of the flexible PCB; (c) a visco-elastic central shock-absorbing member positioned between the upper portion and the lower portion of the flexible PCB preventing the upper portion from contacting the lower portion, where the central shock-absorbing member electrically insulates the upper portion from the lower portion; and (d) a flexible housing that includes an internal cavity that receives the plurality of battery cells, the flexible PCB, and the central shock-absorbing member. The CWB may also include a plurality of visco-elastic battery cell shock-absorbing members, where each battery cell shock-absorbing member of the plurality of battery cell shock-absorbing members being individually attached to an outward facing surface of each battery cell. Each battery cell shock-absorbing member may have an opening that is substantially aligned with a center of a pouch cell portion of each battery cell. The opening may have an area that is within a range of 30 percent and 70 percent of an area of a front surface of the battery cell shock-absorbing member, where the area of the front surface is defined as the area of the front surface that is free of the opening. At least one battery cell shock-absorbing member of the plurality of shock-absorbing members may contact an interior surface of the housing. A thickness of the central shock-absorbing member may be substantially the same as a thickness of one of the plurality of battery cell shock-absorbing members. In some examples, a thickness of the central shock-absorbing member may be within a range of 1.2 and 1.4 times a thickness of one of the plurality of battery cell shock-absorbing members. The central shock-absorbing member may be continuous and extend at least 90 percent of a width of the upper portion of the flexible PCB. A thickness of the central shock-absorbing member may be within a range of 2 percent and 5 percent of a thickness of the conformal wearable battery, where the thickness of the conformal wearable battery is defined as a distance from an outermost outward facing surface of an upper housing member to an outermost outward facing surface of a lower housing member. The central shock-absorbing member may be the same material as a battery cell shock-absorbing member of the plurality of battery cell shock-absorbing members, and where the central shock-absorbing member comprises polyurethane.

Other aspects of this disclosure may relate to a conformal wearable battery that includes (a) a plurality of battery cells; (b) a flexible printed circuit board (PCB) that includes a plurality of physical connection sections, where each of the plurality of battery cells is physically affixed to the flexible PCB at a corresponding physical connection section of the plurality of physical connection sections and a bend axis that facilitates folding of the flexible PCB to form an upper portion of the flexible PCB and a lower portion of the flexible PCB; (c) a plurality of battery cell shock-attenuating members, each battery cell shock-attenuating member of the plurality of battery cell shock-attenuating members being individually attached to an outward facing surface of each battery cell, where each battery cell shock-attenuating member is a foam member and has an opening that extends through the battery cell shock-attenuating member; and (d) a housing that includes an upper housing member, a lower housing member, and an internal cavity, wherein the internal cavity that receives the plurality of battery cells, the flexible PCB, and the plurality of battery cell shock-attenuating members. A first battery cell shock-attenuating member of the plurality of battery cell shock-attenuating members contacts an interior surface of the lower housing member and a second battery cell shock-attenuating member of the plurality of battery cell shock-attenuating members contacts an interior surface of the upper housing member. When a battery cell of the plurality of battery cells increases in volume, one of a battery cell shock-attenuating member of the plurality of shock-attenuating members is compressed. A thickness of a battery cell shock-attenuating member of the plurality of battery cell shock-attenuating members may be within a range of 4 percent and 12 percent of a thickness of a battery cell of the plurality of battery cells. The opening of the plurality of battery cell shock-attenuating members may have an oval shape. The CWB may also include a central shock-attenuating member, where the central shock-attenuating member may be positioned between the upper portion and the lower portion of the flexible PCB to prevent the upper portion from contacting the lower portion. The central shock-attenuating member may electrically insulate the upper portion from the lower portion. In addition, a thickness of the central shock-attenuating member may be substantially the same as a thickness of a battery cell shock-attenuating member of the plurality of battery cell shock-attenuating members.

Still additional aspects of this disclosure may relate to a system that includes: (a) a plurality of battery cells; (b) a flexible printed circuit board (PCB) that has a plurality of physical connection sections, where each of the plurality of battery cells may be physically affixed to the flexible PCB at a corresponding physical connection section of the plurality of physical connection sections and a bend axis that may facilitate folding of the flexible PCB to form an upper portion of the flexible PCB and a lower portion of the flexible PCB; (c) a central shock-attenuating member formed from a polymeric foam material, where the central shock-attenuating member may be positioned between the upper portion and the lower portion that prevents the upper portion of the flexible PCB from contacting the lower portion of the flexible PCB; (d) a plurality of battery cell shock-attenuating members formed from a polymeric foam material, where each battery cell shock-attenuating member of the plurality of battery cell shock-attenuating members may be individually attached to an outward facing surface of each battery cell of the plurality of battery cells; and (e) a housing that includes an internal cavity, where the internal cavity receives the plurality of battery cells, the flexible PCB, the central shock-attenuating member, and the plurality of battery cell shock-attenuating members. A battery cell shock-attenuating member of the plurality of battery cell shock-attenuating members may contact an interior surface of the housing. When a battery cell of the plurality of battery cells increases in volume, one of a battery cell shock-attenuating member of the plurality of shock-attenuating members or the central shock-attenuating member may be compressed. In addition, when a battery cell of the plurality of battery cells increases in volume, the battery cell that increases in volume may expand into a cavity formed by an opening in each battery cell shock-attenuating member of the plurality of battery cell. A thickness of a battery cell shock-attenuating member of the plurality of battery cell shock-attenuating members may be within a range of 4 percent and 12 percent of a thickness of a battery cell of the plurality of battery cells. The central shock-attenuating member may contact both inward facing surfaces of the upper portion and the lower portion of the flexible PCB.

BRIEF DESCRIPTION OF THE DRAWINGS

The present disclosure is illustrated by way of example and not limited in the accompanying figures in which like reference numerals indicate similar elements and in which.

DETAILED DESCRIPTION

Figure 1:
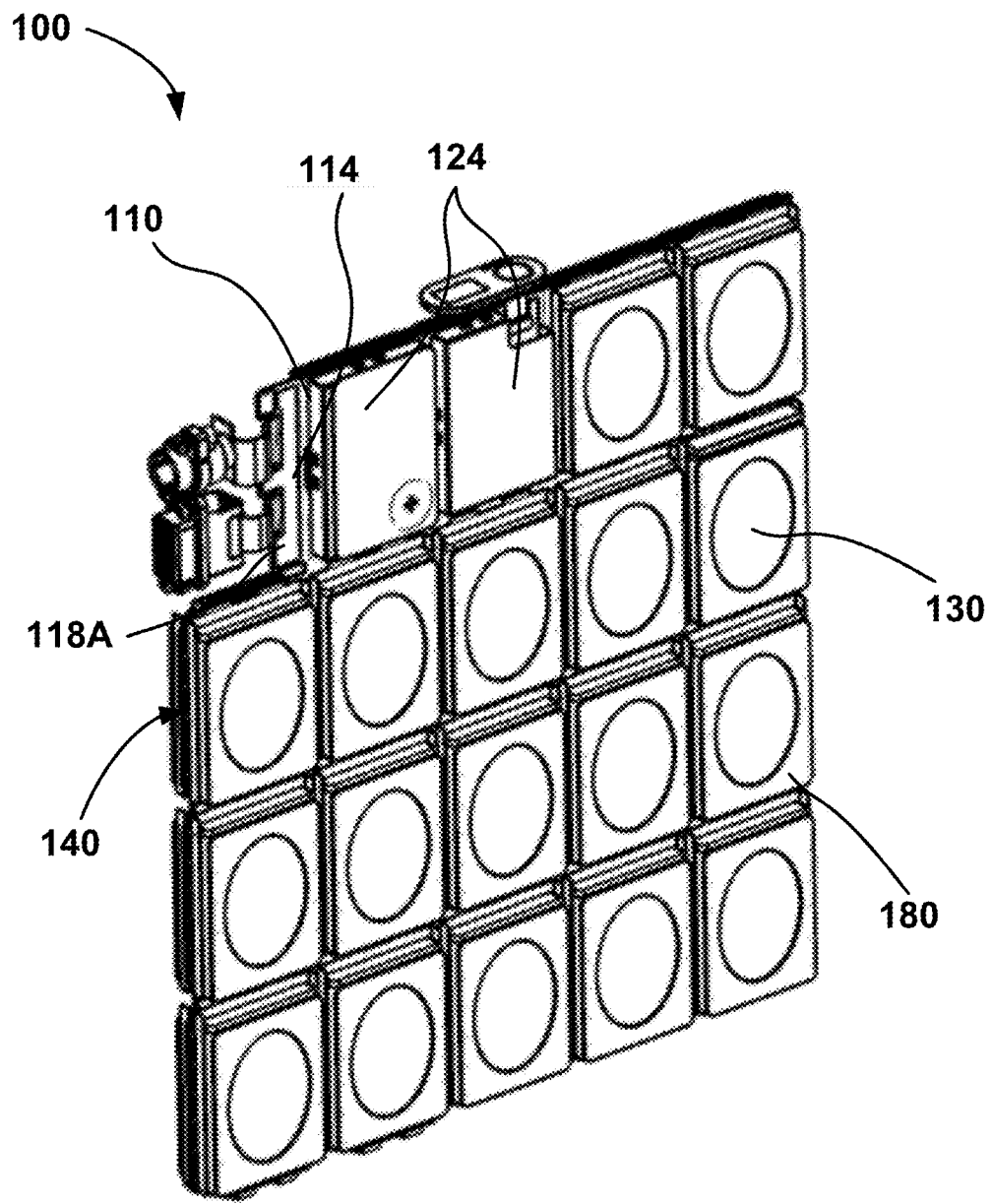
FIG. 1 illustrates a front perspective view of a battery cell assembly for a conformal wearable battery (CWB) according to aspects described herein.

In the following description of various illustrative arrangements, reference is made to the accompanying drawings, which form a part hereof, and in which is shown, by way of illustration, various arrangements in which aspects of the disclosure may be practiced. It is to be understood that other arrangements may be utilized, and structural and functional modifications may be made, without departing from the scope of the present disclosure. It is noted that the accompanying drawings may not be drawn to scale.

It is noted that various connections between elements are discussed in the following description. It is noted that these connections are general and, unless specified otherwise, may be direct or indirect, and that the specification is not intended to be limiting in this respect.

A rechargeable conformal wearable battery (CWB) may be worn by a user to power electronic devices that the user carries. The CWB may be subjected to a multitude of environmental conditions such as harsh shock and vibration, moisture exposure, and extreme temperatures. The CWB may have a housing that is sealed to facilitate longer battery life and utility for the user regardless of environmental conditions it may encounter. To provide a desired power output, the CWB may include a plurality of battery cells, each with a rated power capacity and when electrically connected, may allow the CWB to provide a desired power output.

A CWB may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be encased or housed in a battery cell housing (e.g., a pouch, a metal enclosure, etc.) separate from other battery cells. A battery cell as described herein may include a plurality of individual battery cell elements that are electrically connected together to form a compound battery cell that electrically performs as a single unit. Each of the battery cells may be physically connected to adjacent battery cells by flexible elements (e.g., a flexible printed circuit board), thereby facilitating a surface outline or shape of the array of battery cells to generally conform to a surface outline or shape of a user wearing the CWB. For example, the CWB may include one or more flex lines along which the CWB may flexibly conform to a shape of an object adjacent to the CWB, such as a portion of a user's body. One or more of the battery cells may include a positive-charge electrical terminal and a negative-charge electrical terminal that are electrically connected with the battery cell within an interior of the battery cell and provide electrical power to electrical devices disposed exterior to the battery cell. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell. The CWB may include a set of positive-charge and negative-charge electrical terminals that are shared among the plurality of the battery cells of the array of battery cells. The plurality of the battery cells may be electrically coupled together, for example, in series or in parallel.

In some cases, each battery cell may be formed of electrodes and a solid electrolyte that are stacked in layers or laminations and enclosed in a foil envelope housing, which is then sealed. The positive-charge terminal and the negative-charge terminal may each include a conductive region that passes between the interior of the cell housing and the exterior of the cell housing.

The CWB housing may secure a plurality of the battery cells within an interior region. may be formed from a molding process such as injection molding. The CWB housing may be formed of a polymeric material, for example. The CWB housing may be sealed to prevent ingress of solid material and/or liquid material, for example, according to an IP67 rating, IP68 rating, or other ingress protection rating. The CWB housing may include a plurality of electrically conductive contacts and/or connectors that may pass between the interior region of the CWB housing and the exterior of the CWB housing. The IP67 rating is specified by the Ingress Protection Code (IP Code) IEC standard 60529. The equivalent European standard is EN 60529. The IP Code also may be referred to as the International Protection Code. The IP Code classifies and rates a degree of ingress protection provided by mechanical casings and electrical enclosures for electronic equipment against intrusion, dust, accidental contact, and liquid (e.g., water). In the IP67 rating, the first digit (i.e., '6') specifies a level of protection offered against ingress of solid objects, while the second digit (i.e., '7') specifies a level of protection offered against ingress of liquids. The larger the value of the digit specifying the level of protection, the greater the amount of protection offered. For example, an IP67 rating specifies total protection against dust ingress and protection against short periods of immersion in water. An IP68 rating specifies dust resistance and immersion in 1.5 meters of freshwater for up to 30 minutes duration.

Figure 2:
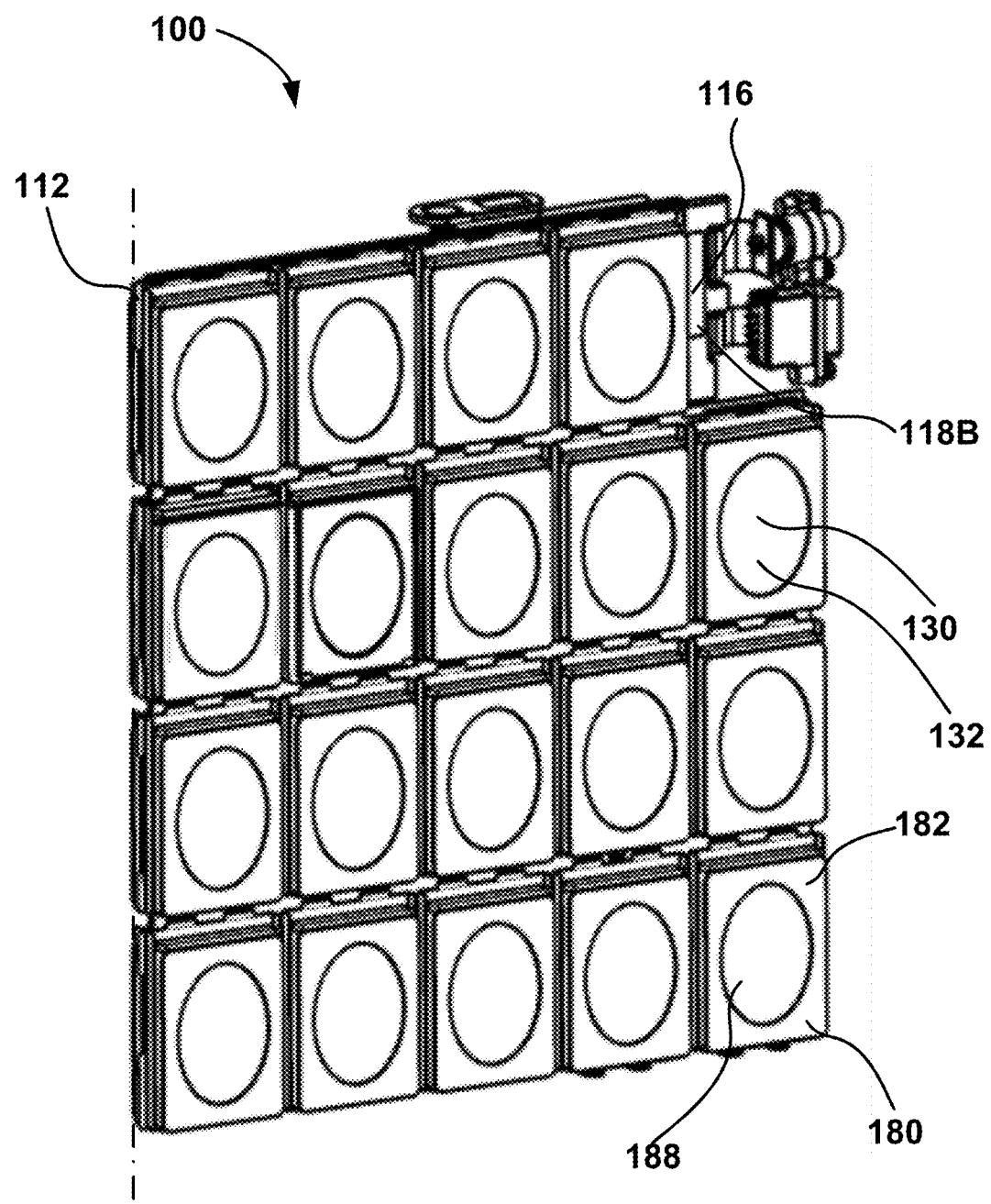
FIG. 2 illustrates a rear perspective view of the battery cell assembly of FIG. 1 according to aspects described herein.

FIGS. 1 and 2 illustrate an exemplary battery cell assembly or flexible printed circuit board assembly (PCBA) 100 of an exemplary CWB 10. In some examples, the CWB 10 may be provided in a form factor easily carried by a person, such as within a pocket or other means of securing the CWB 10 to a person's clothing, uniform, or the like. As shown in FIGS. 1 and 2, the battery cell assembly or PCBA 100 may include a flexible printed circuit board (PCB) 110 with a plurality of battery cells 130 connected both electrically and physically to the PCB 110. To provide the specified power output, while also providing flexibility for conforming to a shape of person's body or equipment when carried, a matrix of battery cells 130 may be arranged on, and affixed to, a flexible printed circuit board 110. To fit within the housing 160 of the CWB 10, the flexible printed circuit board 110 may have a bend axis 112 (e.g. a centerline) that facilitates folding of the flexible PCB 110 to form a upper portion 114 of the flexible PCB 110 and a lower portion 116 of the flexible PCB 110. Each portion 114, 116 may be substantially the same size (i.e., same surface area). The battery cell 130 may be mounted on an outward facing surface 118A, 118B of each respective portion 114, 116 of the flexible printed circuit board 110 while the electrical connections may be made on an inward facing surface 120A, 120B of the respective upper and lower portions 114, 116 of the folded PCB 110. A central shock-attenuating or shock-absorbing member 140 may be positioned between the upper portion 114 and the lower portion 116 to prevent the upper portion 114 from contacting the lower portion 116. The central shock-attenuating member 140 may absorb or dampen any shock and/or vibrational loading the CWB 10 may receive while also providing electrical insulation for the electrical contacts.

Figure 3A:
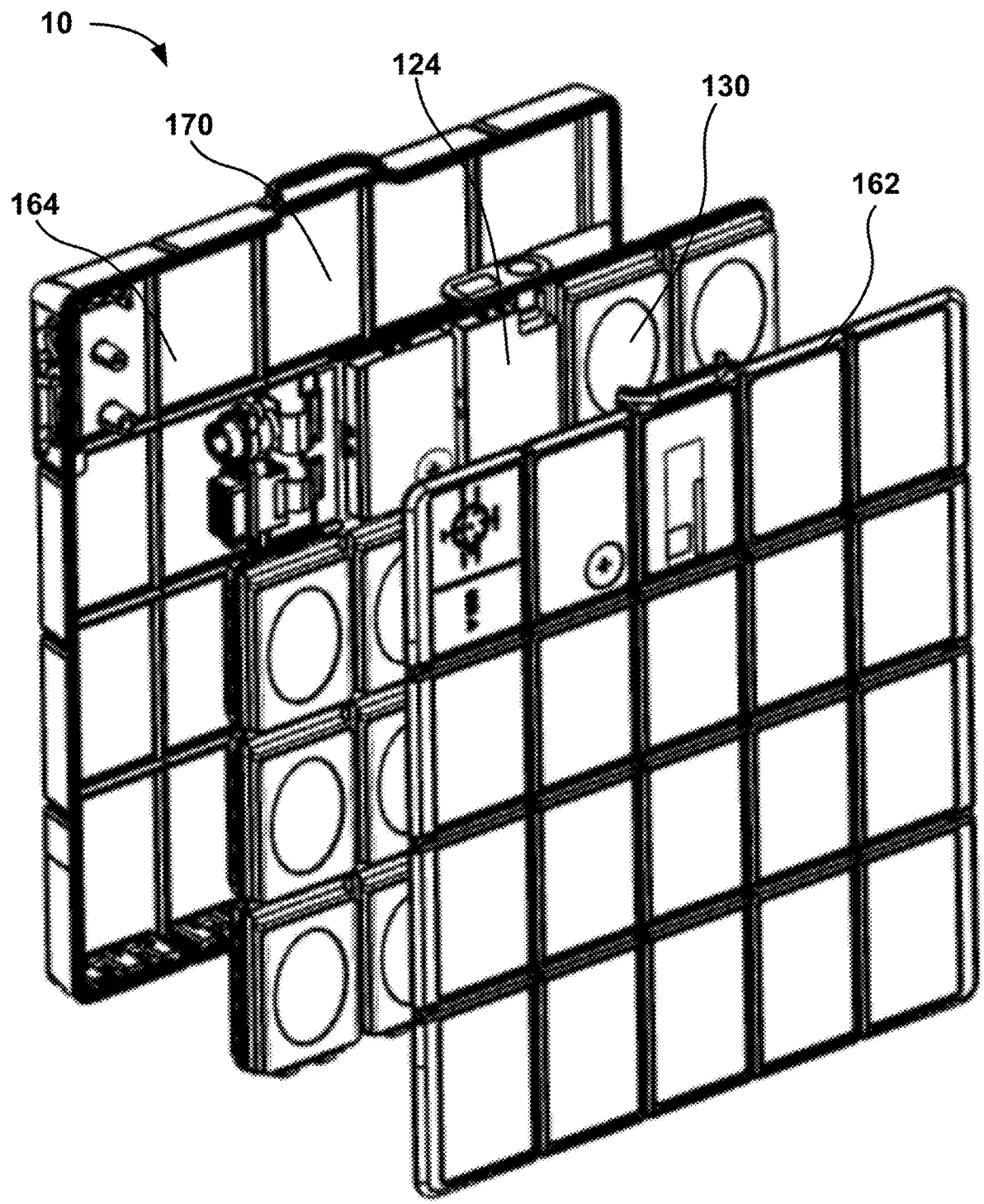
FIG. 3A illustrates a front exploded perspective view of a conformal wearable battery with the battery cell assembly of FIG. 1 according to aspects described herein.
Figure 3B:
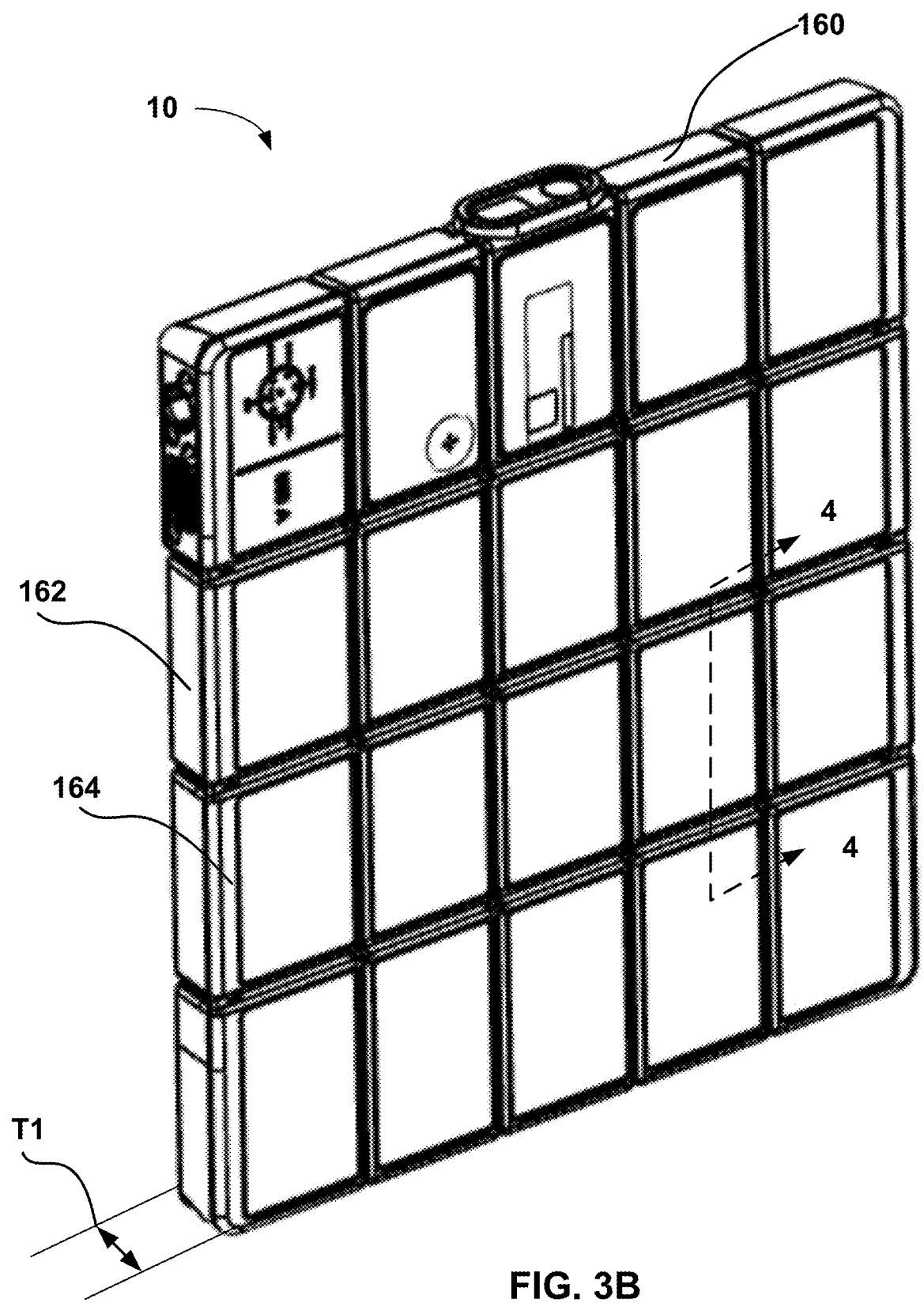
FIG. 3B illustrates a front perspective view of the conformal wearable battery of FIG. 3A according to aspects described herein.

As shown in FIGS. 3A-3B, the battery cell assembly 100 may be received into an interior cavity 166 of a housing 160 to provide protection for the CWB 10. The housing 160 may include an upper housing member 162 and a lower housing member 164 that may be connected together to form the interior cavity 166. In addition, the upper housing member 162 and lower housing member 164 may be sealed together along the perimeter to protect the battery cell assembly 100 to prevent ingress of solid material and/or liquid material. A damaged battery cell 130 may be a fire hazard and/or could render the CWB 10 inoperable. Accordingly, CWB 10 may meet the requirements of MIL-PRF-32383/4A. Each housing member 162, 164 may be flexible and may be formed from a polymeric material using an injection molding or other technique known to one skilled in the art. Accordingly, housing 160 (and each housing member 162, 164) may be flexible or bendable to be able to withstand repeated bending or flexing cycles to allow CWB 10 to meet the requirements of MIL-PRF-32383/4A. CWB 10 may be required to flex at least 800 times under load to a 7 inch radius curved surface, such that an edge of the CWB 10 may be capable of deflecting, in each direction, at least a specified distance (i.e., 1 inch) from a centerline of the CWB 10 without sustaining physical or electrical damage. MIL-PRF-32383/4A is incorporated by reference in its entirety. The housing members 162, 164 may be injection molded from a polymeric material that has elastomeric properties to allow the housing members 162, 164 and housing 160 to flex and bend. For example, the housing members 162, 164 may be formed from a thermoplastic elastomer (TPE), a thermoplastic urethane (TPU), thermoplastic vulcanizates (TPV), or other similar material.

Figure 4:
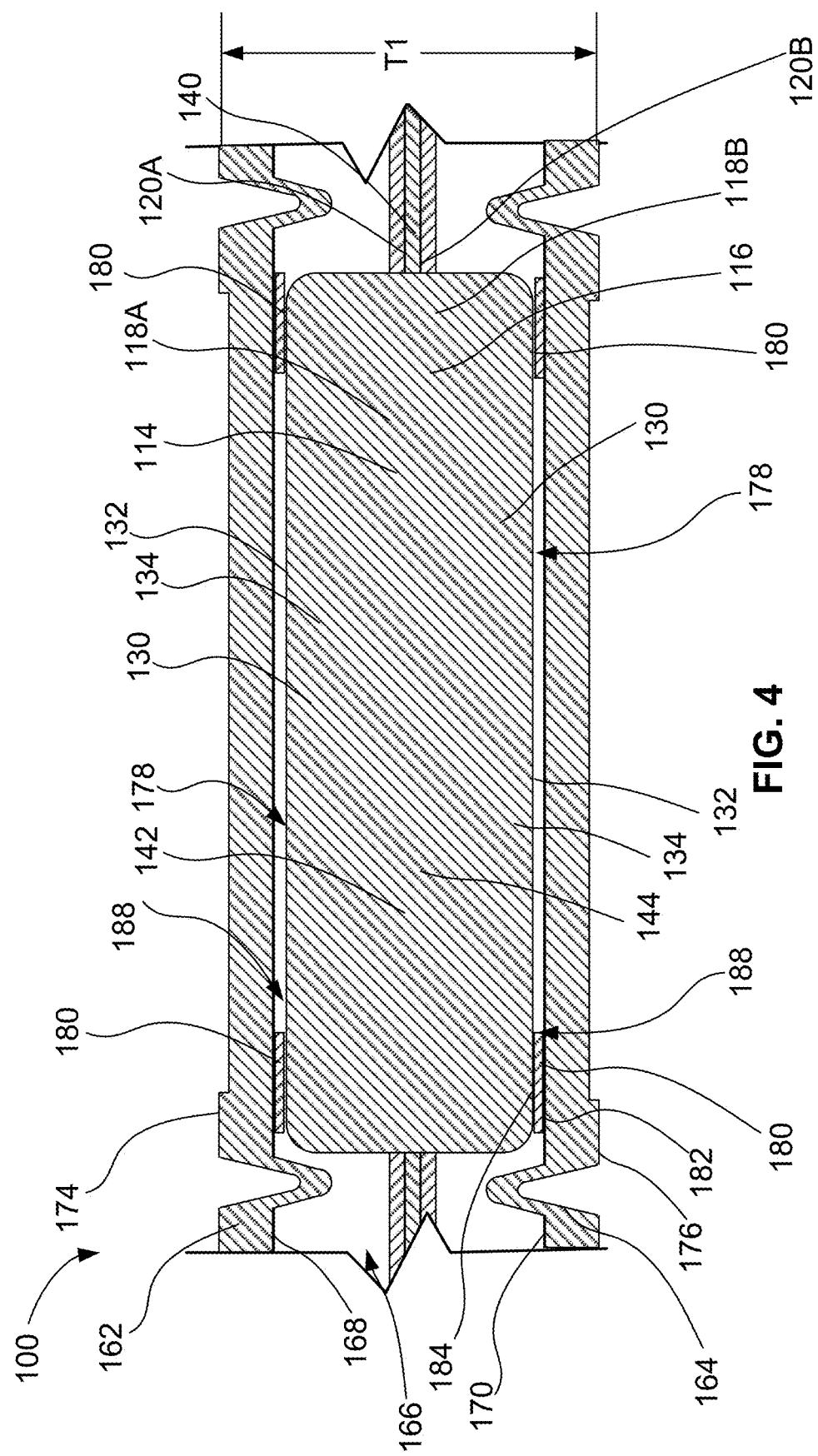
FIG. 4 illustrates a cross-sectional side view of the CWB of FIG. 3B according to aspects described herein.

The arrangement of the battery cells 130 on the outward facing surfaces 118A, 118B of the flexible PCB 110 positions an outward facing surface 132 of each battery cell 130 to face an interior surface 168 of the upper housing member 162 or an interior surface 170 of the lower housing member 164 as shown in FIG. 4. Additionally, a plurality of battery cell shock-attenuating members 180 may be individually attached to the outward facing surface 132 of each battery cell 130. Similar to the central shock-attenuating member 140, each battery cell shock-attenuating member 180 may be electrically insulating. Each battery cell shock-attenuating member 180 may be positioned between the outward facing surface 132 and one of the interior surfaces 168, 170. In addition, each battery cell shock-attenuating member 180 may also contact one of the interior surfaces 168, 170 of the housing members 162, 164. The central shock-attenuating member 140 may be located between the battery cells 130 arranged on the upper and lower portions 114, 116 of PCB 110, where shock-attenuating member 140 may be in contact with both inward facing surfaces of the upper portion 114 and the lower portion 116 of the flexible PCB 110. The battery cell shock-attenuating members 180 may located between the battery cells 130 and the housing 160. The central shock-attenuating member 140 and/or the battery cell shock-attenuating members 180 may help to protect the battery cells 130 by absorbing the forces received by the CWB 10 from any impacts or collisions. As shown in FIG. 4, this arrangement of having three distinct shock-attenuating members 140, 180 spaced apart from each other through a cross-section of the CWB 10 to provide protection from impacts for the battery cells 130 throughout the CWB 10. Each shock-absorbing member 140, 180 may compress up to 80 percent when subjected to an impact load. For instance, each shock-absorbing member 140, 180, when compressed 80 percent, may absorb up to 400N of force over an area of 1140 mm$^2$ area, or 0.35 N/mm$^2$ (0.35 MPa). In addition, at higher strain rates, such as impact or shock loading, each shock-absorbing member 140, 180 may be compressed up to 80 percent of the thickness, where the member 140, 180 may push back against the impact with a pressure of less than or up to 0.40 N/mm$^2$ (0.40 MPa). In some cases, the shock-attenuating members 140, 180 may absorb up to 30 percent and in some cases up to 50 percent of an impact force applied to the CWB 10 to protect the battery cells 130 from the impact force.

The battery cells 130 may be a pouch cell type battery (i.e., a packaged polymer lithium-ion battery or similar type battery). For instance, each battery cell 130 may include a pouch cell portion 134 and a foil portion 136 that wraps around at least three sides of the pouch cell portion 134. The foil portion 136 may have a length that is greater than a length of the pouch battery portion. In addition, the foil portion 136 may contact the sides of the pouch cell portion 134 across the width of the battery cell 130. Each battery cell 130 may have a non-cylindrical shape and may have generally rectangular cuboid shape or a substantially parallelepiped shape. Further, a chemical system of battery cell 130 may include one of a lithium cobalt oxide, nickel cobalt manganese, nickel cobalt aluminum, or other such chemical systems. In an illustrative example, the dimensions of the battery cell 130 may be about 43 mm in length, about 34 mm in width, and about 6 mm in height, but battery cells of other dimensions may be used within the scope of this disclosure. Additionally, the battery cell 130 may weigh between 22.5 grams and 24.5 grams (i.e., 23.5 grams) and may have an energy storage capacity between 1400 mAh and 1500 mAh (i.e., about 1,435 mAh). The size, weight, and energy storage capacity of each battery cell 130 of the CWB 10 may be designed such that the overall size, weight, and energy storage capacity of the flexible PCBA 100 for the CWB 10 meets an energy storage capacity specification, weight specification, and/or size specification for a CWB 10. For example, the height, width, and length of each battery cell 130 may be designed, at least in part, to meet a flexibility requirement of the CWB 10. Additionally, the size, and/or shape of the battery cells may allow for a specified number of battery cells (e.g., about 36 battery cells) and/or configuration of the battery grid such that the energy capacity for the CWB 10 may be at least 148 Watt-hours (Wb) (e.g., about 150 Wh, about 170 Wh, about 190 Wh, about 200 Wh, etc.) and/or where the maximum weight of the CWB 10 is less than a specified maximum weight (e.g., about 2.6 pounds). In some cases, a configuration of the battery cells 130 of the CWB 10 may allow the CWB 10 to output a voltage between about 10 and about 20 V, (e.g., about 14.8V) within a specified size and/or shape of the CWB. For example, an illustrative CWB 10 may have an overall dimensions of between about 8.5 in. and 9.0 inches (i.e., about 8.7 in.)× between about 7.5 in and 8 in. (i.e., about 7.66 in.)×between about 0.5 in. and 0.8 in. (i.e., 0.70 in.).

As the battery cells 130 go through cycles of discharging and recharging, the chemical reaction inside the battery cells 130 may cause the battery cells 130 to swell or increase in volume. In some examples, the battery cells 130 may also go through cycles of swelling and then shrinking (i.e., increasing and decreasing in volume) as it goes through the discharging and recharging cycles. When a battery cell 130 swells, the cell 130 may expand into a cavity or void 178 created by an opening 188 in the battery cell shock-attenuating member 180. In some cases, the battery cells 130 may encounter swelling of less than 4 percent. In other cases, the battery cells 130 may swell in a range between 4 percent and 10 percent. In still other cases, the battery cells 130 may encounter swelling of about 15 percent or less. In addition, each battery cells 130 may swell different amounts in various locations of the battery cell 130. For instance, each battery cell 130 may experience a greater amount of swelling in a central region than along its edges.

The flexible PCB 110 for the conformal wearable battery 10 according to aspects of the present disclosure. The flexible PCB 110 may be configured to provide power and/or electrical signals from a plurality of battery cells and/or other components of a CWB. The flexible PCB 110 may be formed of one or more of a flexible polymer or plastic material, such as a polyimide or other such flexible substrate. In some cases, markings showing locations of placement of battery cells may be formed through a silk screening process or other like method. Electrical conductors may be included in one or more layers of the flexible PCB 110. In some cases, electrical conductors may be configured as a conductive pattern (e.g., a copper overlay, a conductive ink, etc.) on the surface of the substrate of the flexible PCB 110. In some cases, exposed conductive features (e.g., conductors, a bare copper surface, a bare aluminum surface, etc.) may be coated with a coverlay substance, such as an electrical insulator. For conductive portions of the flexible PCB not covered with a coverlay, the surface may be plated, such as with an electroless nickel immersion gold (ENIG) finish, a lead-free immersion silver finish or other substances with improved conductive properties. The flexible PCB 110 may have a plurality of physical connection sections disposed in a grid like pattern, where each of the plurality of battery cells 130 is physically affixed to the flexible PCB 110 at a corresponding physical connection section of the plurality of physical connection sections.

Figure 5:
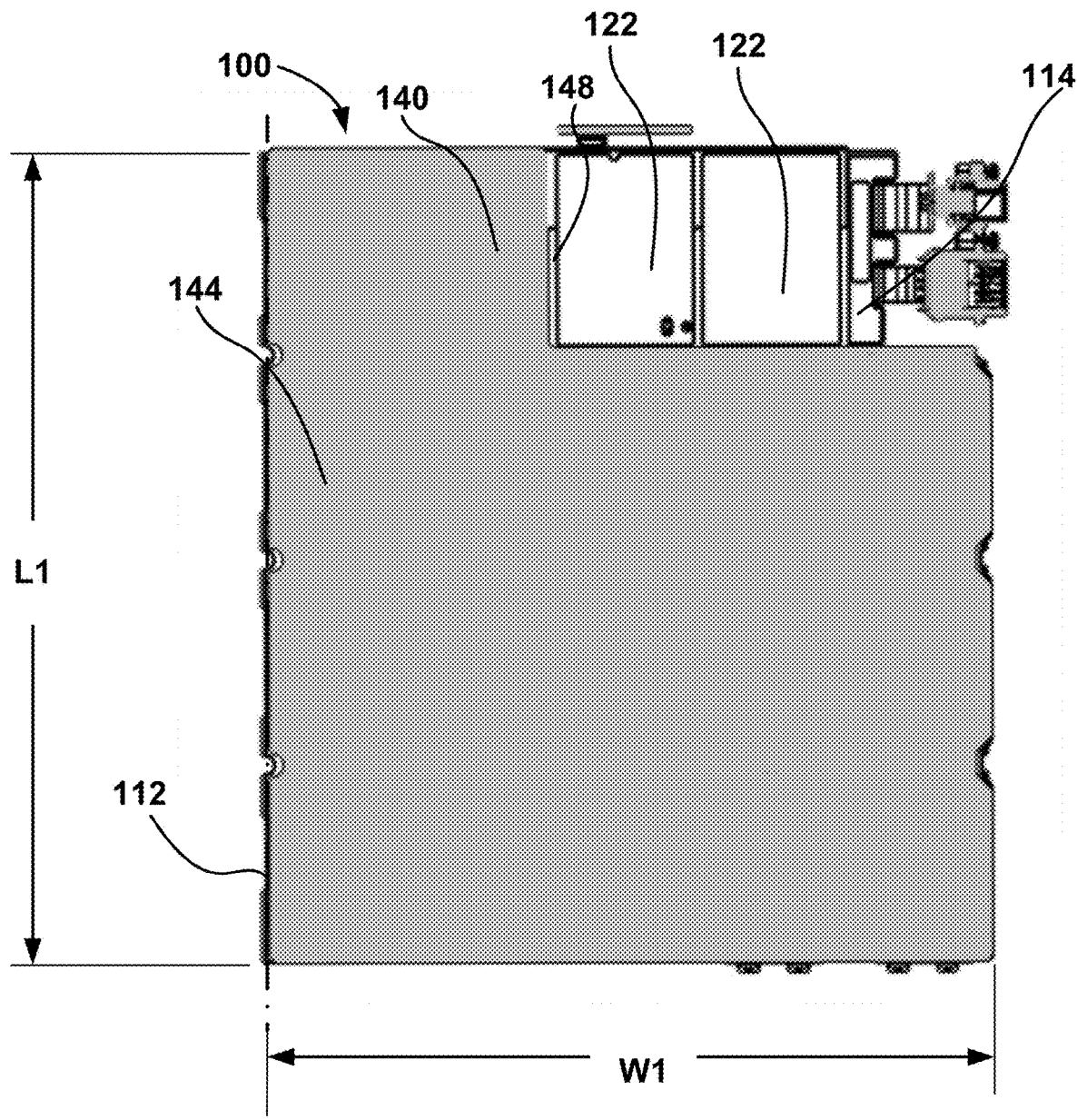
FIG. 5 illustrates a rear view of the battery cell assembly of FIG. 1 with some components removed for clarity according to aspects described herein.
Figure 6:
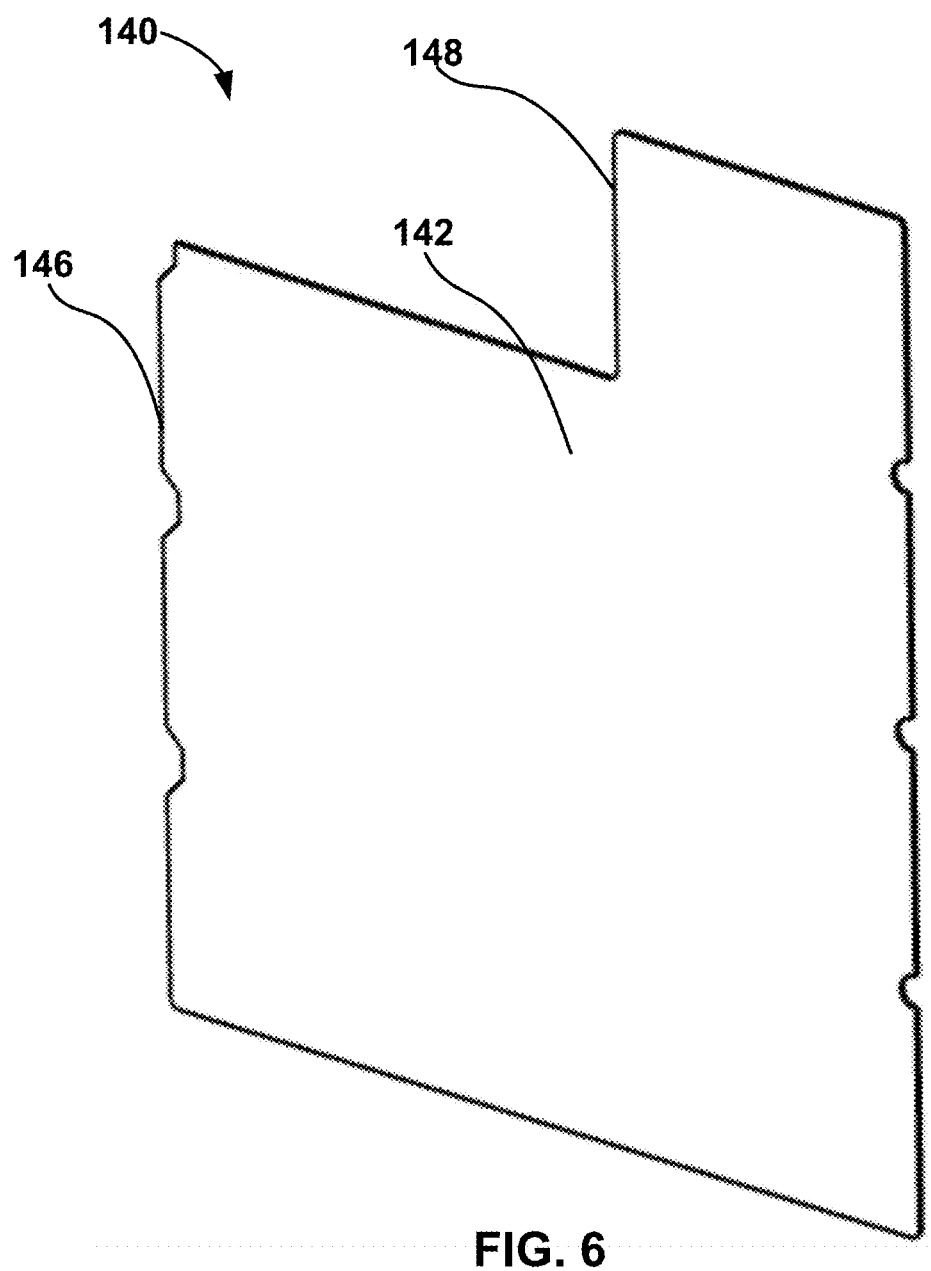
FIG. 6 illustrates a front perspective view of an exemplary central shock-attenuating member of the battery cell assembly of FIG. 1 according to aspects described herein.
Figure 7:
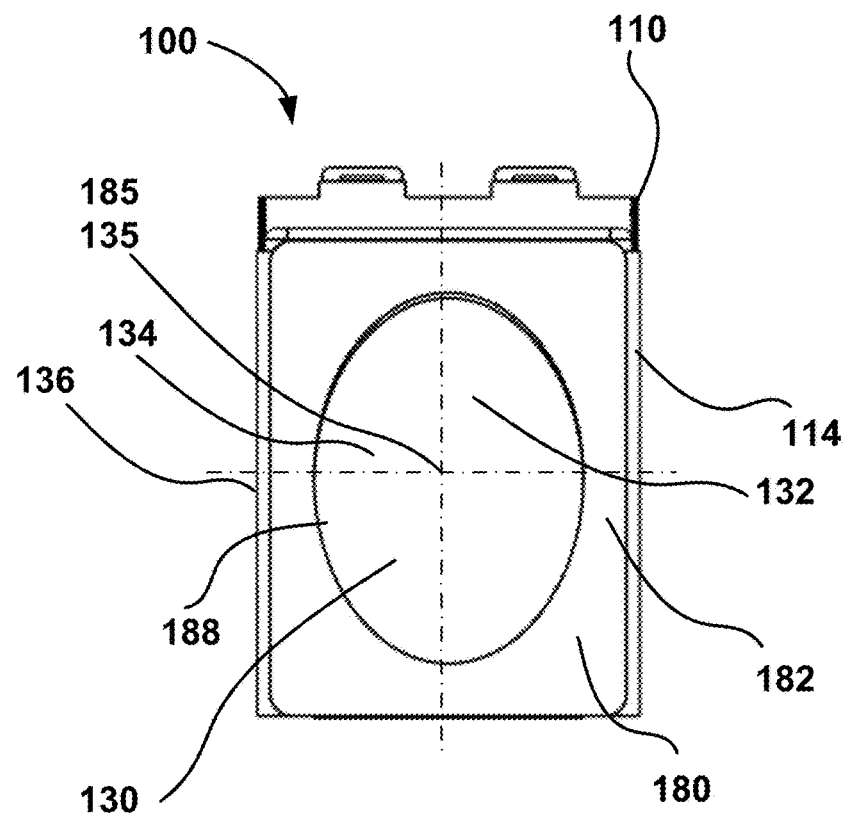
FIG. 7 illustrates a front view of a portion of the battery cell assembly of FIG. 1 according to aspects described herein.
Figure 8:
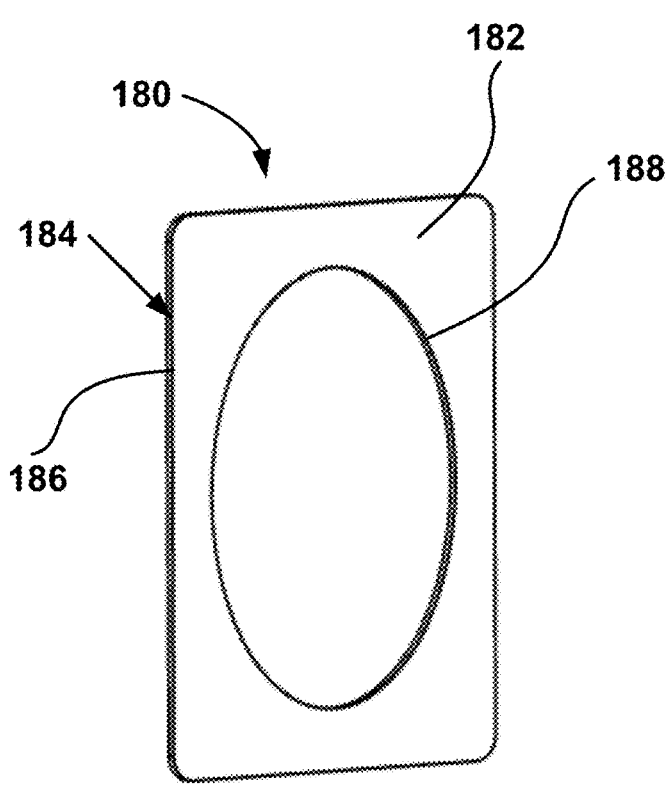
FIG. 8 illustrates a front perspective view of an exemplary battery cell shock-attenuating member of the battery cell assembly of FIG. 1 according to aspects described herein.

The central shock-attenuating member 140 may be positioned between the upper and lower portions 114, 116 and may also contact the inward facing surfaces 120A, 120B of the PCB 110. The central shock-attenuating member 140 may compress to absorb any impacts or forces that are received by the CWB 10. As shown in FIGS. 5 and 6, the central shock-attenuating member 140 may be a continuous layer free of openings or holes that extend through the central shock-attenuating member 140 in the region that corresponds to the PCB 110. The central shock-attenuating member 140 may also serve to electrically insulate the upper and lower portions 114, 116 from each other. The central shock-attenuating member 140 may have a front surface 142, a rear surface 144 opposite the front surface 142, and a perimeter surface 146 extending between the front surface 142 and the rear surface 144. The central shock-attenuating member 140 may have a geometric shape that generally follows the overall footprint or outline of the plurality of battery cells 130 arranged on the upper portion 114 of the PCB 110. The central shock-attenuating member 140 may have a rectangular shaped cutout 148 at one corner to accommodate stiffeners 122 arranged on the inward facing surface 120A of upper portion 114 of PCB 110. The stiffeners 122 may help to stabilize the region of the flexible PCB 110 where the CWB control circuitry 124 is mounted.

FIG. 5 illustrates the battery assembly 100 with the lower portion 116 of PCB 110 along with its attached battery cells 130 removed for clarity. As shown in FIG. 5, the central shock-attenuating member 140 may have a length, L1, and width, W1, that extends substantially the same length and width of one of the upper and lower portions 114, 116 of the PCB 110. For example, the central shock-attenuating member 140 may have a width that extends at least 90 of a width of the upper portion 114 and/or the lower portion 116 of PCB 110. The central shock-attenuating member 140 may be affixed to one or both of the inward facing surfaces 118A or 118B of the PCB 110 with an adhesive, such as with a glue, an epoxy, an acrylic, or a tape. In some examples, the central shock-attenuating member 140 may be free floating between the inward facing surface 118A and 118B or only attached along its perimeter.

Each battery cell shock-attenuating member 180 may have an opening 188 extending through the thickness of the battery cell shock-attenuating member 180. Each opening 188 may create a cavity 178 between the respective outward facing surface 132 of the battery cell 130 and one of the interior surfaces 168, 170 of the housing 160. The cavity 178 may provide room for a battery cell 130 to expand into the cavity 178 to prevent any swelling induced stress on the battery cell 130 as it expands. The thickness of the battery cell shock-attenuating member 180 may be approximately 10 percent of the thickness of the battery cell 130, or may be within a range of 4 percent and 12 percent of the thickness of the battery cell 130. In some examples, the opening 188 may not extend through the entire thickness of the battery cell shock-attenuating member 180 creating cavity 178 within the battery cell shock-attenuating member 180. For example, the opening 188 may extend from the rear surface 184 through at least 50 percent of the thickness, or through at least 75 percent of the thickness. In these cases, the depth of the cavity 178 may be within a range of 4 percent and 12 percent of the thickness of the battery cell 130.

In some examples, the battery cell shock-attenuating members 180 may have a front surface 182, a rear surface 184 opposite the front surface, a perimeter surface 186 extending between the front surface 182 and the rear surface 184, and an opening 188 extending through the front and rear surfaces 182, 184. The opening 188 may be located in substantially the center 185 of the battery cell shock-attenuating member 180 and may be substantially aligned with a center 135 (i.e., a horizontal and/or a vertical centerline) of a pouch cell portion 134 each battery cell 130. For purposes of this disclosure, substantially aligned means that a first axis extending normal from a geometric center point of a first component is collinear with a second axis extending in the same direction as the first axis from a geometric center of a second component are within 2 mm of each other. In some examples, the opening 188 may be offset from a center of the pouch cell portion 134. The shape of the battery cell shock-attenuating member 180 may be substantially rectangular although it may have any geometric shape, such as oval, circular, or other polynomial. In general, the shape of the battery cell shock-attenuating member 180 may correspond to the shape of each battery cell 130, where the length and width of the battery cell shock-attenuating member 180 may be substantially the same or within 5 percent of the length and width of the length and width of each battery cell 130. The perimeter edges of the battery cell shock-attenuating member 180 may extend to and cover the perimeter edges of the corresponding battery cell 130 that it is attached. The rear surface 184 of each battery cell shock-attenuating member 180 may be affixed the outward facing surface 132 of each respective battery cell 130 with an adhesive, such as a glue, an epoxy, an acrylic, or a tape.

As shown in the illustrated example, the opening 188 may have an oval shape or may have a different shape such as a rectangular shape, circular shape, or other geometric shape. In some examples, the opening 188 may have a size that has an area that is within a range of 30 percent and 70 percent of an area of the front surface 182 of the shock-absorbing member 140, where the area of the front surface 182 is defined as the area of the front surface 182 that is free of the opening 188. While in other examples, the opening 188 of each battery cell shock-attenuating member 180 may have an area that is at least 70 percent of the surface area of member 140.

The central shock-attenuating member 140 and the battery cell shock-attenuating members 180 may be formed from a visco-elastic material that can attenuate shock and vibration while also having electrically insulating properties. In addition, the shock-attenuating members 140, 180 may be compressible to assist in absorbing any swelling from the battery cells 130. The battery cells 130 may swell on one side or both sides (i.e. a front and rear side of the battery cell 130). The shock-attenuating members 140, 180 may be very compressible at low strain rates, such as a battery cell 130 swelling, where each member 140, 180 may compress less than 50 percent of its thickness, the shock-absorbing members 140, 180 may push back against the swelling battery with a pressure of less than or up to 0.05 N/mm2 (0.05 MPa). As such, if any of the battery cells 130 swell, a portion of the swelling may be absorbed by the compression of the shock-attenuating members 140, 180 to prevent any swelling induced stress on the expanded battery cell 130. In some examples, the shock-attenuating members 140, 180 may be compressed within a range of 7 percent and 12 percent. The shock-attenuating members 140, 180 may be resilient to resist any permanent deformation caused by any swelling of the battery cells 130. This resilience allows for the shock-attenuating members 140, 180 to compress and expand to accommodate any cycling of a battery cell 130 swelling and then contracting partly or completely back to its normal size. By compressing and expanding to correspond with the swelling and shrinking of the battery cell 130, the shock-absorbing members 140, 180 may not permanently deform or may have a minimal compression set. In some examples, the shock-attenuating members 140, 180 may have a maximum compression set of between 2 percent and 5 percent when tested using ASTM D 1667-90 Test D @ 73° F. (23° C.).

The visco-elastic material may be formed from a polymeric material such as a polyurethane based material such as Poron®, Sorbothane® or similar material. In some cases, the visco-elastic material may absorb heat to assist in conducting heat away from the batteries. The central shock-attenuating member 140 and/or the battery cell shock-attenuating members 180 may be formed from the same material or, in some examples, formed from different materials. The material forming the central shock-attenuating members and/or the battery cell shock-attenuating members 180 may be a polymeric foam (i.e., porous) or a solid polymeric material. The central shock-attenuating members and/or the battery cell shock-attenuating members 180 may be formed from a sheet of material and then cut to the final shape using a die cutting, laser cutting, water jet cutting process, or other cutting process known to one skilled in the art. The central shock-attenuating members 140 and/or the battery cell shock-attenuating members 180 may have a constant thickness, where the thickness of the central shock-attenuating member 140 may substantially the same thickness (i.e., within 10 percent) as a thickness of at least one of the plurality of battery cell shock-attenuating members 180. In some examples, the thickness of the central shock-attenuating member 140 may be greater than a thickness at least one of the plurality of battery cell shock-attenuating members 180. For instance, the thickness of the central shock-attenuating member 140 may be within a range of 1.2 and 1.4 times a thickness of one of the plurality of battery cell shock-attenuating members 180. Additionally, the thickness of the central shock-attenuating member 140 may be approximately 3 percent of the overall thickness of the CWB 10, where the thickness of the housing 160 is defined as the distance, T1, from an outermost outward facing surface 174 of the upper housing member 162 to an outermost outward facing surface 176 of the lower housing member 164. In some examples, the thickness of the central shock-attenuating member 140 may be within a range of 2 percent and 5 percent of the thickness, T1, of the housing 160. In addition, the combined thicknesses of the shock-absorbing members 140, 180 may be approximately 9 percent of the overall thickness T1 of the CWB 10, or within a range of 7 percent and 11 percent of the overall thickness, T1.

Aspects of the disclosure have been described in terms of illustrative examples thereof. Numerous other examples, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

What is claimed is:

1. A conformal wearable battery comprising:
    a plurality of non-cylindrical shaped polymer battery cells; and
    a flexible printed circuit board (PCB) comprising:
        a plurality of physical connection sections disposed in a grid like pattern, wherein each of the plurality of battery cells is physically affixed to the flexible PCB at a corresponding physical connection section of the plurality of physical connection sections; and
        a bend axis that facilitates folding of the flexible PCB to form an upper portion of the flexible PCB and a lower portion of the flexible PCB;
    a visco-elastic central shock-absorbing member positioned between the upper portion and the lower portion of the flexible PCB preventing the upper portion from contacting the lower portion, wherein the central shock-absorbing member electrically insulates the upper portion from the lower portion; and
    a flexible housing that includes an internal cavity that receives the plurality of battery cells, the flexible PCB, and the central shock-absorbing member.

2. The conformal wearable battery of claim 1, further comprising:
    a plurality of visco-elastic battery cell shock-absorbing members, each battery cell shock-absorbing member of the plurality of battery cell shock-absorbing members being individually attached to an outward facing surface of each battery cell, wherein each battery cell shock-absorbing member has an opening that is substantially aligned with a center of a pouch cell portion of each battery cell.

3. The conformal wearable battery of claim 2, wherein the opening has an area that is within a range of 30 percent and 70 percent of an area of a front surface of the battery cell shock-absorbing member, wherein the area of the front surface is defined as the area of the front surface that is free of the opening.

4. The conformal wearable battery of claim 2, wherein at least one battery cell shock-absorbing member of the plurality of battery cell shock-absorbing members contacts an interior surface of the housing.

5. The conformal wearable battery of claim 2, wherein a thickness of the central shock-absorbing member is substantially the same as a thickness of one of the plurality of battery cell shock-absorbing members.

6. The conformal wearable battery of claim 2, wherein a thickness of the central shock-absorbing member is within a range of 1.2 and 1.4 times a thickness of one of the plurality of battery cell shock-absorbing members.

7. The conformal wearable battery of claim 1, wherein the central shock-absorbing member is continuous and extends at least 90 percent of a width of the upper portion of the flexible PCB.

8. The conformal wearable battery of claim 1, wherein a thickness of the central shock-absorbing member is within a range of 2 percent and 5 percent of a thickness of the conformal wearable battery, wherein the thickness of the conformal wearable battery is a distance from an outermost outward facing surface of an upper housing member to an outermost outward facing surface of a lower housing member.

9. The conformal wearable battery of claim 2, wherein the central shock-absorbing member is the same material as a battery cell shock-absorbing member of the plurality of battery cell shock-absorbing members, and wherein the central shock-absorbing member comprises polyurethane.

10. A conformal wearable battery comprising:
    a plurality of battery cells; and
    a flexible printed circuit board (PCB) comprising:
        a plurality of physical connection sections, wherein each of the plurality of battery cells is physically affixed to the flexible PCB at a corresponding physical connection section of the plurality of physical connection sections;

a bend axis that facilitates folding of the flexible PCB to form an upper portion of the flexible PCB and a lower portion of the flexible PCB;

a plurality of battery cell shock-attenuating members, each battery cell shock-attenuating member of the plurality of battery cell shock-attenuating members being individually attached to an outward facing surface of each battery cell, wherein each battery cell shock-attenuating member is a foam member and has an opening that extends through the battery cell shock-attenuating member; and a housing that includes an upper housing member, a lower housing member, and an internal cavity, wherein the internal cavity that receives the plurality of battery cells, the flexible PCB, and the plurality of battery cell shock-attenuating members, wherein a first battery cell shock-attenuating member of the plurality of battery cell shock-attenuating members contacts an interior surface of the lower housing member and a second battery cell shock-attenuating member of the plurality of battery cell shock-attenuating members contacts an interior surface of the upper housing member.

11. The conformal wearable battery of claim 10, wherein when a battery cell of the plurality of battery cells increases in volume, one of a battery cell shock-attenuating member of the plurality of shock-attenuating members is compressed.

12. The conformal wearable battery of claim 10, wherein a thickness of a battery cell shock-attenuating member of the plurality of battery cell shock-attenuating members is within a range of 4 percent and 12 percent of a thickness of a battery cell of the plurality of battery cells.

13. The conformal wearable battery of claim 10, wherein the opening of the plurality of battery cell shock-attenuating members has an oval shape.

14. The conformal wearable battery of claim 10, further comprising:
a central shock-attenuating member, the central shock-attenuating member positioned between the upper portion and the lower portion of the flexible PCB preventing the upper portion from contacting the lower portion, wherein the central shock-attenuating member electrically insulates the upper portion from the lower portion.

15. The conformal wearable battery of claim 14, wherein a thickness of the central shock-attenuating member is substantially the same as a thickness of a battery cell shock-attenuating member of the plurality of battery cell shock-attenuating members.

16. A system comprising:
a plurality of battery cells; and
a flexible printed circuit board (PCB) comprising:
a plurality of physical connection sections, wherein each of the plurality of battery cells is physically affixed to the flexible PCB at a corresponding physical connection section of the plurality of physical connection sections;
a bend axis that facilitates folding of the flexible PCB to form an upper portion of the flexible PCB and a lower portion of the flexible PCB;

a central shock-attenuating member formed from a polymeric foam material, the central shock-attenuating member positioned between the upper portion and the lower portion preventing the upper portion of the flexible PCB from contacting the lower portion of the flexible PCB;

a plurality of battery cell shock-attenuating members formed from a polymeric foam material, each battery cell shock-attenuating member of the plurality of battery cell shock-attenuating members being individually attached to an outward facing surface of each battery cell of the plurality of battery cells; and a housing that includes an internal cavity, wherein the internal cavity receives the plurality of battery cells, the flexible PCB, the central shock-attenuating member, and the plurality of battery cell shock-attenuating members, wherein a battery cell shock-attenuating member of the plurality of battery cell shock-attenuating members contacts an interior surface of the housing.

17. The system of claim 16, wherein when a battery cell of the plurality of battery cells increases in volume, one of a battery cell shock-attenuating member of the plurality of shock-attenuating members or the central shock-attenuating member is compressed.

18. The system of claim 16, wherein when a battery cell of the plurality of battery cells increases in volume, the battery cell that increases in volume expands into a cavity formed by an opening in each battery cell shock-attenuating member of the plurality of battery cell shock-attenuating members.

19. The system of claim 16, wherein a thickness of a battery cell shock-attenuating member of the plurality of battery cell shock-attenuating members is within a range of 4 percent and 12 percent of a thickness of a battery cell of the plurality of battery cells.

20. The system of claim 16, wherein the central shock-attenuating member contacts both inward facing surfaces of the upper portion and the lower portion of the flexible PCB.

* * * * *